US006478923B1

United States Patent
Igarashi

(10) Patent No.: US 6,478,923 B1
(45) Date of Patent: Nov. 12, 2002

(54) VACUUM OPERATION APPARATUS

(75) Inventor: Toru Igarashi, Tokyo (JP)

(73) Assignee: NEC Corporation, Tokyo (JP)

( * ) Notice: Subject to any disclaimer, the term of this patent is extended or adjusted under 35 U.S.C. 154(b) by 98 days.

(21) Appl. No.: 09/640,817

(22) Filed: Aug. 17, 2000

(30) Foreign Application Priority Data

Aug. 20, 1999 (JP) .......................................... 11-233940

(51) Int. Cl.[7] ................................................ C23F 1/02
(52) U.S. Cl. ............................. 156/345.26; 156/345.1; 156/345.24; 118/715
(58) Field of Search ........................... 156/345; 118/715

(56) References Cited

U.S. PATENT DOCUMENTS

| 5,250,092 A | | 10/1993 | Nakano |
| 5,445,521 A | | 8/1995 | Yamaguchi et al. |
| 5,685,912 A | | 11/1997 | Nishizaka |
| 5,803,107 A | * | 9/1998 | Kaveh et al. .................. 137/14 |
| 5,888,579 A | | 3/1999 | Lun |
| 5,958,510 A | * | 9/1999 | Sivaramakrishnam et al. ... 427/255.6 |
| 6,022,483 A | * | 2/2000 | Aral ............................. 216/59 |
| 6,189,483 B1 | * | 2/2001 | Ishikawa et al. ............ 118/723 |

FOREIGN PATENT DOCUMENTS

| JP | 61-32576 | 2/1986 |
| JP | 1-92367 | 4/1989 |
| JP | 4-349195 | 12/1992 |
| JP | 05-251362 | 9/1993 |
| JP | 6-318536 | 11/1994 |
| JP | 7-126097 | 5/1995 |
| JP | 09-069515 | 3/1997 |
| JP | 09-082691 | 3/1997 |
| JP | 10-74738 | 3/1998 |
| JP | 10-256230 | 9/1998 |

* cited by examiner

Primary Examiner—Gregory Mills
Assistant Examiner—Karla Moore

(57) ABSTRACT

A vacuum operation apparatus includes a chamber, exhaust device, exhaust pipe, pressure control orifice, residence time control variable orifice, and control section. The chamber is set to a predetermined vacuum pressure in order to operate a wafer. The exhaust device evacuates the chamber. The exhaust pipe connects the exhaust device and chamber. The pressure control orifice is disposed in the exhaust pipe to control the pressure in the chamber. The residence time control variable orifice is disposed in the exhaust pipe so as to open/close independently of the pressure control orifice, and controls the residence time of gas in the chamber. The control section has a memory storing in advance an operating condition corresponding to an operation executed in the chamber, and controls driving of the exhaust device and the opening degree of the pressure control orifice.

7 Claims, 4 Drawing Sheets

FIG. 4

| NAME OF OPERATION | OPERATING CONDITIONS ||||
|---|---|---|---|---|
| | CONTENTS OF OPERATION | OPENING DEGREE OF SLIDE TYPE VALVE 12 | PRESSURE IN CHAMBER 10 | OTHERES |
| ETCHING OPERATION A | LOW PRESSURE AND GREAT FLOW RATE | 80 % | 5 mT (0.7 Pa) | ...... |
| ETCHING OPERATION B | MIDDLE PRESSURE AND MIDDLE FLOW RATE | 55 % | 80 mT (10 Pa) | ...... |
| ETCHING OPERATION C | HIGH PRESSURE AND LITTLE FLOW RATE | 20 % | 200 mT (26 Pa) | ...... |
| ETCHING OPERATION D | MIDDLE PRESSURE AND GREAT FLOW RATE | 100 % | 100 mT (13 Pa) | ...... |
| ...... | ...... | ...... | ...... | |

VACUUM OPERATION APPARATUS

BACKGROUND OF THE INVENTION

1. Field of the Invention

This invention relates to a vacuum operation apparatus and, more particularly, to a vacuum operation apparatus which can set a desired vacuum pressure and residence time for each operation and can cope with various operating conditions.

2. Description of the Prior Art

A vacuum operation process such as CVD (Chemical Vapor Deposition) or dry etching is used in film formation operation and lithography operation in a semiconductor device manufacturing process. In this vacuum operation process, for example, a wafer is placed in an airtight operation chamber, and the operation chamber is evacuated by a vacuum exhaust pump. Then, a reaction gas is supplied to perform an operation such as CVD or etching using plasma ions produced by RF power, radicals (neutral active species), or the heat of a heater.

The schematic structure of a vacuum operation apparatus for executing a vacuum operation process will be described with reference to FIGS. 1A and 1B.

The vacuum operation apparatus shown in FIGS. 1A and 1B is constituted by a chamber 30, an exhaust pipe 31 connected to the chamber 30, a pressure control orifice 33 which is disposed in the exhaust pipe 31 to control the pressure in the chamber 30, and a focus ring 36 which surrounds a wafer 35 placed on a wafer support 34 in the chamber 30, focuses an etching species such as plasma ions on the operation surface of the wafer, and achieves a desired residence time on the wafer operation surface.

A reaction gas for performing an operation such as etching for a wafer is supplied to the chamber 30. The pressure in the chamber 30 is controlled to be suitable for conditions for each operation by adjusting the opening degree of the pressure control orifice 33.

The diameters of the chamber 30, exhaust pipe 31, and focus ring 36 are designed in accordance with process conditions used so as to optimize the residence time.

For example, when the exhaust pipe 31 is relatively thin with respect to the chamber capacity, the vacuum degree in the chamber 30 is generally low (pressure is high), and the amount of gas flowing from the chamber 30 to the exhaust pipe 31 is small. Such a vacuum operation apparatus with a narrow exhaust port is suitable for an operation at high pressure and little flow rate. The residence time is designed to eliminate any wafer in-plane difference of etching under the conditions of this apparatus.

When the exhaust pipe 31 is relatively thick with respect to the chamber capacity, the vacuum degree in the chamber 30 can be increased (pressure can be decreased), and the amount of gas flowing from the chamber 30 to the exhaust pipe 31 is large. Such a vacuum operation apparatus with a wide exhaust port is suitable for an operation at low pressure and great flow rate. The residence time is designed to eliminate any wafer in-plane difference of etching under the conditions of this apparatus.

In this manner, the conventional vacuum operation apparatus must be designed in consideration of the pressure, flow rate, and residence time for each operating condition. It is difficult to design, maintain, and manage the vacuum operation apparatus. Also, the cost becomes high.

If a vacuum operation apparatus optimally designed for specific operating conditions is used for an operation under different operating conditions, desired operation performance cannot be obtained. An operation in-plane difference occurs on a wafer, which inhibits proper execution of an operation.

SUMMARY OF THE INVENTION

The present invention has been made in consideration of the conventional situation, and has as its object to provide a vacuum operation apparatus capable of performing various operations in one chamber, realizing an appropriate residence time corresponding to each operation, and obtaining desired operation performance.

To achieve the above object, according to the first aspect of the present invention, there is provided a vacuum operation apparatus comprising a chamber for operating a wafer at a predetermined vacuum pressure, an exhaust pipe connected to the chamber to connect the chamber to exhaust means for evacuating the chamber, a pressure control orifice disposed in the exhaust pipe to control a pressure in the chamber, and a residence time control variable orifice which is disposed in the exhaust pipe separately from the pressure control orifice, and opened/closed independently of the pressure control orifice to control the residence time of gas in the vacuum chamber.

According to the first aspect, the residence time control variable orifice can control the exhaust flow rate, and can adjust the residence time in the chamber to be suitable for desired operating conditions. The pressure control orifice can perform fine adjustment for keeping the interior of the chamber at a preset pressure. The residence time control variable orifice and pressure control orifice are separately arranged, and independently opened/closed. Hence, the two steps can be independently done.

This arrangement can set the interior of the chamber to a desired operation state, and can adjust the residence time to a desired value.

The vacuum operation apparatus according to the first aspect comprises pressure measurement means for measuring the pressure in the chamber. The opening degree of the pressure control orifice is controlled in accordance with a measurement value detected by the pressure measurement means, and the residence time control variable orifice is set to an opening degree corresponding to an operation executed in the chamber.

The pressure control orifice is disposed on the exhaust channel of the exhaust pipe, and the residence time control variable orifice is disposed in the exhaust pipe between the chamber and the pressure control orifice. The residence time control variable orifice includes a slide type valve disposed along the outer wall of the chamber.

According to the second aspect of the present invention, there is provided a vacuum operation apparatus in which a semiconductor wafer is placed in a chamber, a reaction gas is supplied to the chamber, and the semiconductor wafer undergoes vacuum operation while a pressure control orifice disposed in an exhaust pipe connected to the chamber controls a pressure in the chamber, comprising a residence time control variable orifice which is opened/closed independently of the pressure control orifice to control the residence time of gas in the chamber, wherein the pressure in the chamber and the residence time can be controlled independently of each other.

According to the second aspect, various operations can be executed in one chamber, and a desired residence time can be realized for each operation. As a result, desired operation performance can be obtained.

The above and many other objects, features and advantages of the present invention will become manifest to those skilled in the art upon making reference to the following detailed description and accompanying drawings in which preferred embodiments incorporating the principle of the present invention are shown by way of illustrative examples.

BRIEF DESCRIPTION OF THE DRAWINGS

FIG. 4 is a table showing an example of operating conditions for each operation set in a control section shown in FIG. 2.

DETAILED DESCRIPTION OF THE PREFERRED EMBODIMENT

A preferred embodiment of the present invention will be described below with reference to the accompanying drawings.

Figure 3A:
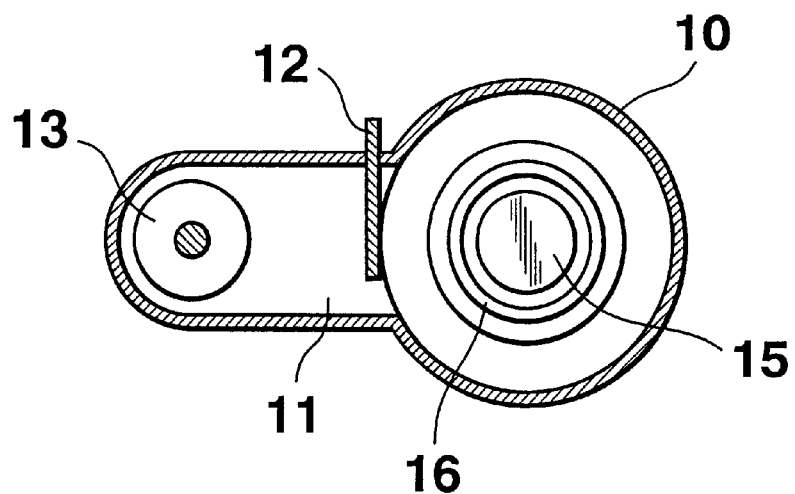
FIGS. 3A and 3B are a plan view and a longitudinal sectional view, respectively, showing the vacuum operation apparatus according to the embodiment of the present invention that is used to manufacture a semiconductor device.
Figure 3B:
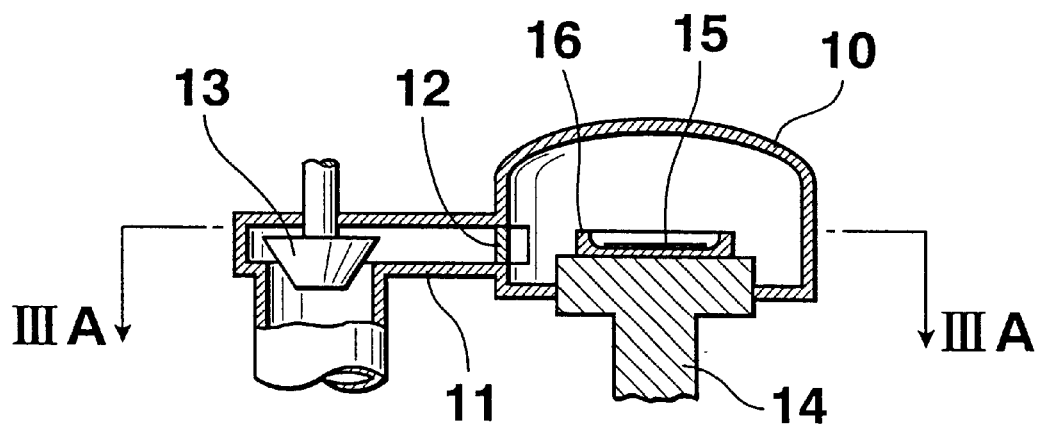

As shown in FIGS. 3A and 3B, a vacuum operation apparatus in this embodiment is constituted by a chamber 10, an exhaust pipe 11 connected to the chamber 10, a slide type valve 12 disposed at the joint between the exhaust pipe 11 and the chamber 10, a pressure control orifice 13 disposed in the exhaust pipe 11 to control the pressure in the chamber 10, and a focus ring 16 which surrounds a wafer 15 placed on a wafer support 14, focuses plasma ions on the operation surface of the wafer, and achieves a desired residence time on the wafer operation surface.

The slide type valve 12 is disposed along the outer wall of the vacuum chamber 10 at the joint between the chamber 10 and the exhaust pipe 11. The slide type valve 12 horizontally opens/closes (slides) to adjust the effective inner diameter of the exhaust pipe 11 and make the residence time in the chamber 10 suitable for desired operating conditions.

Figure 1A:
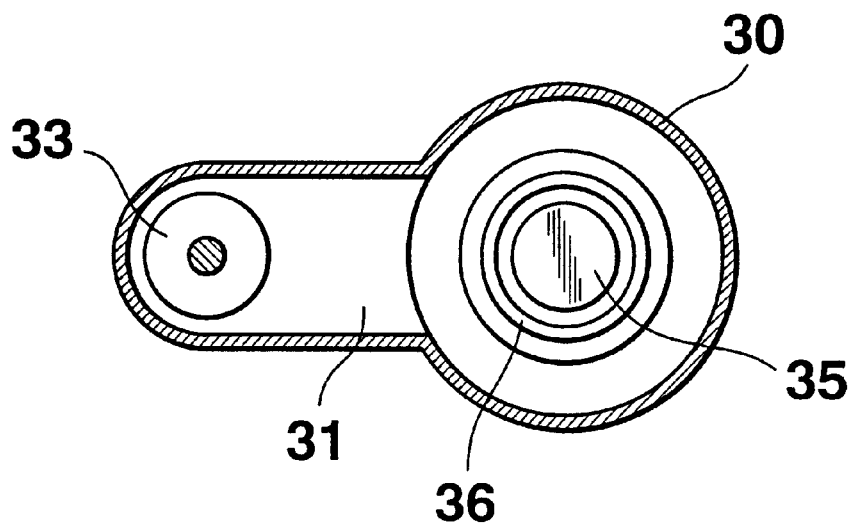
FIGS. 1A and 1B are a plan view and a longitudinal sectional view, respectively, showing a conventional vacuum operation apparatus used to manufacture a semiconductor device.
Figure 1B:
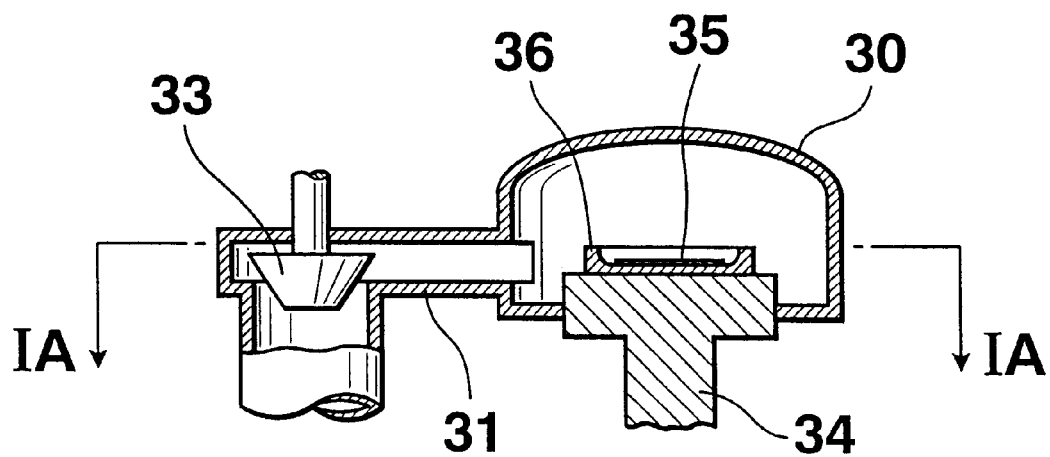
Figure 2:
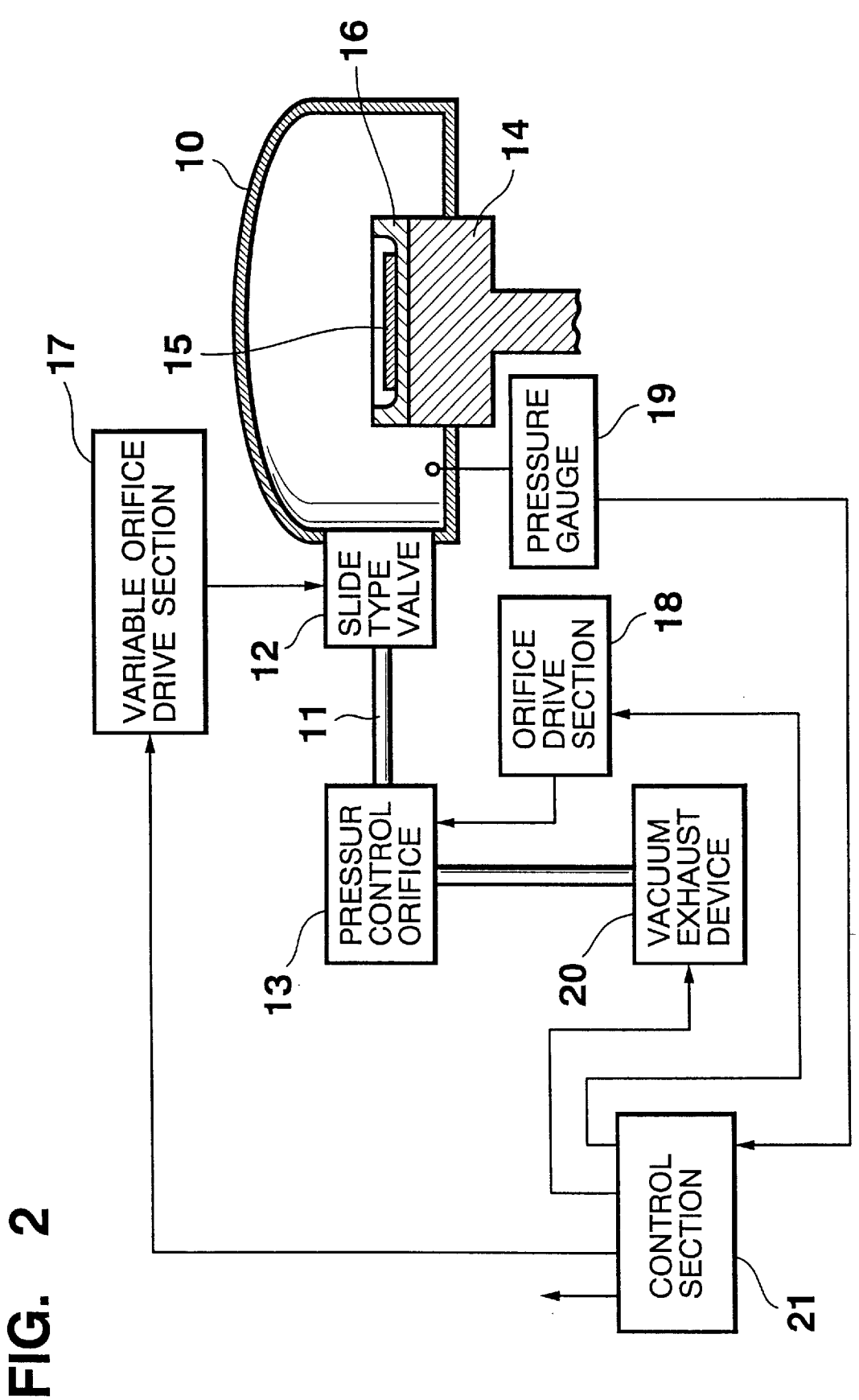
FIG. 2 is a block diagram schematically showing the arrangement of a vacuum operation apparatus according to an embodiment of the present invention that is used to manufacture a semiconductor device.

As shown in FIG. 2, the slide type valve 12 is controlled to have a preset opening degree by a variable orifice drive section 17 in accordance with the operating conditions of an operation executed in the chamber 10.

As shown in the sectional view of FIG. 3B, the pressure control orifice 13 is formed from a tapered orifice disposed at the bent portion of the exhaust pipe 11. As shown in FIG. 2, the opening degree of the pressure control orifice 13 is continuously controlled by an orifice drive section 18. Also, the orifice drive section 18 adjusts the opening degree of the pressure control orifice 13 in correspondence with a pressure signal sent from a pressure gauge 19 connected to the chamber 10 so as to keep the interior of the chamber 10 at a preset pressure.

A control section 21 shown in FIG. 2 controls a series of steps of vacuum operation including exhaust operation and the driving timings of the slide type valve 12 and pressure control orifice 13 in accordance with a preset control program.

The control section 21 comprises an input unit, memory, processor, and the like. The memory stores predetermined operating conditions such as a plurality of operations, the contents of the operations in executing them, the pressure (target value) in the chamber 10, and the opening degree of the slide type valve 12, as shown in FIG. 4.

A method of executing etching operation A as an operation at low pressure and great flow rate shown in FIG. 4 using the vacuum operation apparatus with the above arrangement will be described.

A wafer 15 to be operated is placed on the wafer support 14 of the focus ring 16. The control section 21 sets the opening degree of the slide type valve 12 to a value (80%) set in the table shown in FIG. 4 and that of the pressure control orifice 13 to a full open value (maximum flow rate) via the variable orifice drive section 17 and orifice drive section 18. Setting the opening degree of the slide type valve 12 to 80% sets the effective diameter of the exhaust pipe 11.

In this state, a vacuum exhaust device 20 having an exhaust pump connected to the chamber 10 via the exhaust pipe 11 is controlled to evacuate the chamber 10 and exhaust a residual gas.

A reaction gas for vacuum operation such as etching or sputtering is supplied from a gas supply device (not shown) to the chamber 10. While the reaction gas is supplied, the orifice drive section 18 decreases the opening degree of the pressure control orifice 13 so as to set the pressure in the chamber 10 to a predetermined value of 5 mT (0.7 Pa).

If the vacuum pressure in the chamber 10 reaches a pressure necessary for the operation upon the lapse of a predetermined time, the orifice drive section 18 continuously controls the opening degree of the pressure control orifice 13 based on a pressure signal sent from the pressure gauge 19, thereby keeping the pressure in the chamber 10 at a target value. In this state, the wafer 15 undergoes vacuum operation such as etching.

After the wafer 15 undergoes vacuum operation, the supply of the reaction gas is stopped, and the slide type valve 12 and pressure control orifice 13 are fully opened to exhaust the reaction gas left in the vacuum chamber 10. Then, the vacuum operation process of the wafer 15 ends.

By opening the slide type valve 12 wide, the conductance of the residence time control variable orifice increases to decrease the pressure difference between the chamber 10 and the exhaust pipe 11, which enables low-pressure control. Since the opening degree of the slide type valve 12 is adjusted to optimize the residence time at low pressure and great flow rate, desired etching can be done.

As an example of an operation at high pressure and little flow rate, etching operation C will be explained.

A wafer 15 to be operated is placed on the wafer support 14. The pressure control orifice 13 is fully opened, and the slide type valve 12 is adjusted to an opening degree (20%) set in the table of FIG. 4. This can prepare the same status as a vacuum operation apparatus having a small-diameter exhaust pipe.

In this state, the vacuum exhaust device 20 is controlled to evacuate the chamber 10 and exhaust a residual gas.

A reaction gas is supplied from a gas supply device (not shown) to the chamber 10. While the reaction gas is supplied, the orifice drive section 18 decreases the opening degree of the pressure control orifice 13 so as to set the pressure in the chamber 10 to a predetermined value of 200 mT (26.7 Pa).

If the vacuum pressure in the chamber 10 reaches a pressure necessary for the operation upon the lapse of a predetermined time, the orifice drive section 18 continuously controls the opening degree of the pressure control orifice 13 based on a pressure signal sent from the pressure gauge 19, thereby keeping the pressure in the chamber 10 at a target value. In this state, the wafer 15 undergoes vacuum operation such as etching.

After the wafer 15 undergoes the operation, the supply of the reaction gas is stopped, and the slide type valve 12 and pressure control orifice 13 are fully opened to exhaust the reaction gas left in the chamber 10. Then, the vacuum operation process of the wafer 15 ends.

Since the slide type valve 12 is substantially closed (opening degree: 20%) in etching operation C, the flow rate of reaction gas can be decreased. The conductance of the residence time control variable orifice decreases, the pressure difference between the chamber 10 and the exhaust pipe 11 increases, and the pressure in the vacuum chamber 10 increases. Hence, even the vacuum operation apparatus having the large-diameter exhaust pipe 11 can perform an operation at high pressure and little flow rate similarly to a vacuum operation apparatus having a small-diameter exhaust pipe. A residence time suitable for the conditions of this operation can be realized.

Also for an operation between an operation at low pressure and great flow rate and an operation at high pressure and little flow rate, a desired operation can be executed by appropriately adjusting the opening degree of the slide type valve 12 in accordance with the operating conditions.

As has been described above, the vacuum operation apparatus of this embodiment can properly execute various operations from an operation at low pressure and great flow rate to an operation at high pressure and little flow rate in one chamber by properly setting the opening degree of the slide type valve 12 serving as a variable orifice for controlling the residence time of gas and by adjusting the effective diameter of the exhaust pipe 11. As a result, desired operation performance can be attained.

Note that the present invention is not limited to the above embodiment, and can be variously changed and modified.

For example, the above embodiment adjusts the opening degree of the slide type valve 12 to an opening degree suitable for an operation to be executed before the chamber 10 is evacuated. Alternatively, the slide type valve 12 may be fully opened before the chamber 10 is evacuated, and may be adjusted to a predetermined opening degree after the interior of the chamber 10 changes to a high-vacuum state, in order to enhance the exhaust ability, similar to the pressure control orifice.

The residence time control variable orifice may use various components such as a butterfly valve and restrictor capable of effectively adjusting the diameter of the exhaust pipe 11, instead of the slide type valve. Even with the use of these valves, the residence time in the chamber can be set suitable for desired operating conditions by adjusting the opening degree in accordance with the operating conditions of an operation to be executed. The residence time control variable orifice need not be disposed at the joint (boundary) between the chamber 10 and the exhaust pipe 11, and can be disposed at an arbitrary position though the variable orifice is desirably disposed between the pressure control orifice 13 and the chamber 10.

In the above embodiment, operations to be executed and their operating conditions are set in the control section 21 in advance, and the control section 21 adjusts the opening degree of the residence time control variable orifice. Alternatively, the opening degree of the residence time control variable orifice may be manually adjusted.

The present invention can also be applied to a case wherein the apparatus uses a chamber capable of operating a plurality of wafers at the same time.

What is claimed is:

1. A vacuum operation apparatus comprising:
   a chamber set to a predetermined vacuum pressure in order to operate a wafer;
   an exhaust device for evacuating said chamber;
   an exhaust pipe disposed to connect said exhaust device and said chamber;
   a pressure control orifice disposed in said exhaust pipe to control a pressure in said chamber;
   a residence time control variable orifice which is disposed in said exhaust pipe so as to open/close independently of said pressure control orifice, and controls a flow rate of gas in said exhaust pipe by controlling the opening degree of said residence time control variable orifice, in order to control a residence time of gas in said chamber; and
   a control section which has a memory storing in advance an operating condition corresponding to an operation executed in said chamber, and controls driving of said exhaust device and an opening degree of said pressure control orifice.

2. An apparatus according to claim 1, wherein said apparatus further comprises pressure measurement means for measuring the pressure in said chamber, the opening degree of said pressure control orifice is controlled via said control section in accordance with a measurement value detected by said pressure measurement means, and an opening degree of said residence time control variable orifice is controlled via said control section in accordance with the operation executed in said chamber.

3. An apparatus according to claim 1, wherein said pressure control orifice is disposed on an exhaust channel in said exhaust pipe, and said residence time control variable orifice is disposed in said exhaust pipe between said chamber and said pressure control orifice.

4. An apparatus according to claim 1, wherein said residence time control variable orifice includes a slide type valve disposed along an outer wall of said chamber at a joint between said chamber and said exhaust pipe.

5. An apparatus according to claim 2, wherein said residence time control variable orifice includes a slide type valve disposed along an outer wall of said chamber at a joint between said chamber and said exhaust pipe.

6. An apparatus according to claim 3, wherein said residence time control variable orifice includes a slide type valve disposed along an outer wall of said chamber at a joint between said chamber and said exhaust pipe.

7. A vacuum operation apparatus which performs vacuum operation for a semiconductor wafer, and has a chamber with an interior in which a semiconductor is placed and to which a reaction gas is supplied, and a pressure control orifice disposed in an exhaust pipe connected to the chamber so as to control a pressure in the chamber, comprising:
   a residence time control variable orifice which is opened/closed independently of the pressure control orifice, to control a flow rate of gas in the exhaust pipe by controlling the opening degree of said residence time control variable orifice, in order to control a residence time of gas in said chamber;
   wherein the pressure in the chamber and the residence time can be controlled independently of each other.

* * * * *